United States Patent
Gravrand et al.

(10) Patent No.: US 8,759,932 B2
(45) Date of Patent: Jun. 24, 2014

(54) PHOTODETECTOR WITH A PLASMONIC STRUCTURE

(75) Inventors: Olivier Gravrand, Fontanil-Cornillon (FR); Gérard Destefanis, Saint Egreve (FR); Jérôme Le Perchec, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 533 days.

(21) Appl. No.: 12/955,597

(22) Filed: Nov. 29, 2010

(65) Prior Publication Data

US 2011/0156194 A1   Jun. 30, 2011

(30) Foreign Application Priority Data

Dec. 24, 2009   (FR) ...................................... 09 59569

(51) Int. Cl.
   *H01L 31/0232*   (2006.01)
(52) U.S. Cl.
   USPC ..................................... 257/436; 250/370.01
(58) Field of Classification Search
   USPC ..................................... 257/436; 250/370.01
   See application file for complete search history.

(56) References Cited

U.S. PATENT DOCUMENTS

| 2003/0122210 A1* | 7/2003 | Cohen et al. ................. 257/465 |
| 2006/0175551 A1 | 8/2006 | Fan et al. |
| 2008/0217542 A1* | 9/2008 | Verma et al. ............. 250/370.01 |
| 2009/0146198 A1 | 6/2009 | Joe et al. |
| 2011/0216229 A1* | 9/2011 | Mary et al. .................... 348/273 |

FOREIGN PATENT DOCUMENTS

| FR | 2838561 A1 | 10/2003 |
| WO | WO-0102275 A1 | 1/2001 |

OTHER PUBLICATIONS

Republic of France, Search Report dated Sep. 29, 2010 (2 pgs.).
J. Le Perchec, et al., Plasmon-based photosensors comprising a very thin semiconducting region, American Institute of Physics, Applied Physics Letters 94, 181104 (2009), 3 pgs.
Stephane Collin, Resonances photoniques dans les reseaux metalliques: theorie et application a la photodetection ultrarapide., These De Doctorat De L'Universite Paris 6, soutenue le 25 juillet 2002 (250 pgs.).

* cited by examiner

*Primary Examiner* — Thao X Le
*Assistant Examiner* — Geoffrey Ida
(74) *Attorney, Agent, or Firm* — Heslin Rothenberg Farley & Mesiti P.C.; George S. Blasiak

(57) ABSTRACT

This photodetector comprises a doped semiconductor layer; a reflective layer located underneath semiconductor layer; a metallic structure placed on semiconductor layer that forms, with semiconductor layer, a surface plasmon resonator, a plurality of semiconductor zones formed in semiconductor layer and oppositely doped to the doping of the semiconductor layer; and for each semiconductor zone, a conductor that passes through the photodetector from reflective layer to at least semiconductor zone and is electrically insulated from metallic structure, with semiconductor zone associated with corresponding conductor thus determining an elementary detection surface of the photodetector.

15 Claims, 4 Drawing Sheets

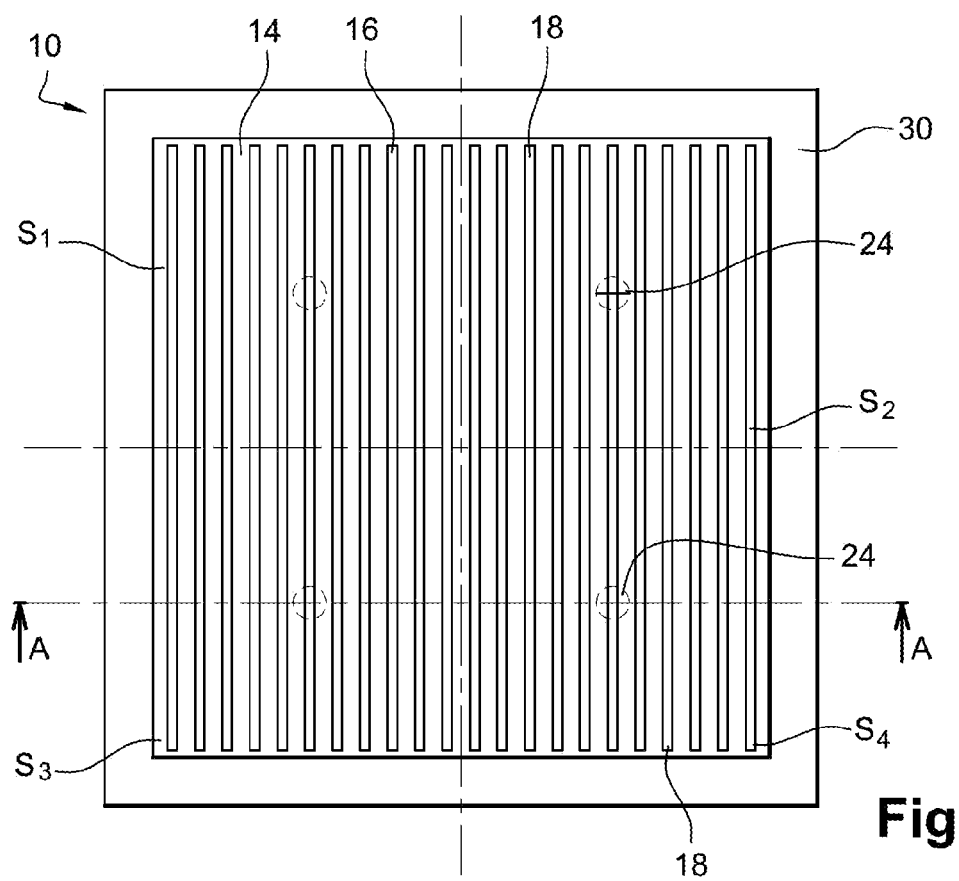
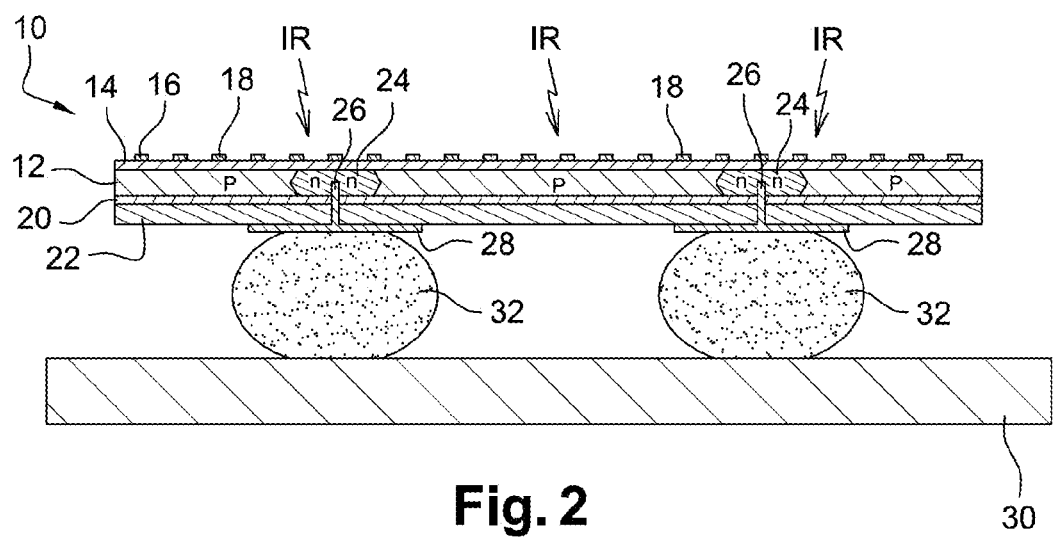

PHOTODETECTOR WITH A PLASMONIC STRUCTURE

CROSS REFERENCE TO RELATED APPLICATIONS

This application claims priority under 35 U.S.C. §119 from French Patent Application No. 0959569 filed on Dec. 24, 2009 in the French Patent Office, the entire disclosure of which is incorporated herein by reference.

FIELD OF THE INVENTION

The present invention relates to the field of detecting electromagnetic radiation, especially infrared, using so-called metallic "plasmonic structures".

PRIOR ART

One known method of detecting infrared radiation involves obtaining absorption of this radiation by a layer of small-gap semiconductor material such as CdHgTe for example. The absorption of photons by this layer then creates electron-hole pairs and the minority carriers thus produced diffuse or drift due to the effect of an electric field in the absorption layer so that they can subsequently be collected at the level of electrodes. Detection quality is then dictated primarily by the dimensions of the absorption layer.

In fact, the quantum efficiency of detection improves, the thicker this layer is. At the same time, the dark current, which is one of the main sources of noise with this type of detection, rises as the volume for collecting the photocarriers increases. Thus, designing such detection must strike a compromise between detection efficiency, as defined by the quantum efficiency, and the quantity of noise that is present in the signal obtained from detection which is partly generated by the dark current.

In order to overcome this problem, photodetectors of the metal-semiconductor-metal type having so-called metallic "plasmonic" structures on their absorption layer(s) have been conceived. Coupling between the incident electromagnetic radiation and surface plasmons is obtained in this way. Making an appropriate choice of said structures, which usually take the form of straight, parallel strips having a rectangular cross-section, then allows very considerable confinement of the electromagnetic field in the absorption layer, thus producing a significant reduction in the dark current.

Besides confining the electromagnetic field in a restricted space, plasmonic structures also make it possible, under certain geometric conditions, to reduce the response time of the detector which is related to the rate at which carriers diffuse into the absorption layer and they also make it possible to apply spectral filtering or polarization selectivity. For further details, the reader should refer to Document WO 01/2275 for example.

However, in this type of photodetector, charge carrier collection is realized through the actual metallic structures, i.e. on the incident radiation side. Thus, a photodetector of this type constitutes a single detection element, a "unitary" detector or even a small-sized linear array. In order to obtain a two-dimensional photodetector that has a plurality of unitary detection elements or pixels, it is then necessary to mount, on a single substrate, a plurality of unitary photodetectors that are independent of each other, something which is expensive or even impossible to do. A classic technique that makes it possible to operate a large number of elements simultaneously is to hybridize the photodetectors on a readout circuit made of silicon using so-called "flip-chip" technology which uses interconnection obtained by solder bumps made of indium in a two-dimensional array of connectors. Unfortunately, in this configuration, the electrodes face the readout circuit, not the incident radiation face, and this makes the plasmonic structure inefficient.

SUMMARY OF THE INVENTION

The object of the present invention is to resolve the above-mentioned problem by proposing a photodetector that allows two-dimensional detection using a single plasmonic structure and semiconductor absorption layer arrangement.

To achieve this, the object of the invention is a photodetector comprising a doped semiconductor layer; a reflective layer located underneath the semiconductor layer; and a metallic structure placed on the semiconductor layer that forms, with the semiconductor layer, a surface plasmon resonator.

According to the invention, the photodetector also comprises a plurality of semiconductor zones formed in the semiconductor layer and oppositely doped to the doping of the semiconductor layer; and for each of said semiconductor zones, a conductor that passes through the photodetector from the reflective layer to at least the semiconductor zone and is electrically insulated from the metallic structure, with the semiconductor zone that is associated with the corresponding conductor thus determining an elementary detection surface of the photodetector.

In other words, the semiconductor zones formed in the absorption layer, in association with the conductors, form zones for collecting the charge carriers created in said layer. The metallic structure therefore only fulfils an optical function and is not used to collect charge carriers. Each semiconductor zone collects the carriers in its immediate vicinity, thus defining a unitary detection element. By forming a grid of semiconductor zones, one obtains a plurality of unitary detection elements, and hence two-dimensional detection, without having to fabricate distinct unitary elements that are then separately mounted on a substrate. In particular, metallic plasmonic structures can be continuous and extend over the entire surface area of the photodetector.

According to the particular embodiments of the invention, the photodetector may comprise one or more of the following aspects.

The photodetector comprises a dielectric tuning layer formed between the reflective layer and the semiconductor layer. This tuning layer makes it possible to adjust the optical frequency at which the detected radiation resonates with the geometry of the metallic structure. Thus, the geometry of the plasmonic structures, but also the thickness of this dielectric layer, are both factors that affect the sizing of the photodetector, especially in terms of its spectral sensitivity range.

The photodetector comprises an insulating passivation layer between the semiconductor layer and the metallic structure. This insulating layer makes it possible to effectively electrically insulate the conductors from the metallic structure, thus preventing electrical connections between the semiconductor layer and the distinctive semiconductor zones of the invention through the metallic structure.

The semiconductor zone is substantially formed in the geometric barycenter of that part of the metallic structure which is bounded by the elementary detection surface. Positioning the semiconductor zone in this way preserves the barycenter of the detected radiation spectrum, regardless of the geometry of the metallic structure.

The part of the metallic structure that is bounded by the elementary detection surface comprises areas having differently oriented parallel patterns, especially areas having patterns with substantially perpendicular orientations. Thanks to these differently oriented patterns, it is possible to detect several polarizations of incident electromagnetic radiation.

The part of the metallic structure that is bounded by the elementary detection surface comprises long thin elements forming closed concentric contours, especially contours that have a substantially square or circular shape. The photodetector is thus not polarization-selective. Other plasmonic structures can be used to obtain non-polarization selectivity, for example a grid of rectangular metallic patches as described, for example, in the paper by Jérome Le Perchec et al., "*Plasmon-based photosensors comprising a very thin semiconducting region*", Appl. Phys. Lett. 94, 181104 (2009), or even a grid of holes formed in a metallic film.

The part of the metallic structure that is bounded by an elementary detection surface comprises parallel patterns with the orientation of the patterns of one elementary detection surface being different to the orientation of the patterns of the adjacent detection surface, especially at right angles. Adjacent pixels that are not sensitive to the same polarizations are obtained in this way. The signals obtained from adjacent pixels can then be combined in order to obtain detection of radiation having several polarization directions.

The part of the metallic structure that is bounded by an elementary detection surface comprises parallel patterns with the spatial periodicity of the patterns of one elementary detection surface being different to the spatial periodicity of the patterns of the adjacent elementary detection zone. This way, adjacent pixels are not sensitive to the same wavelength. It then becomes possible to combine the signals obtained from adjacent pixels in order to obtain non-wavelength selective detection of radiation, while preserving confinement of the electromagnetic field in the semiconductor layer.

In one embodiment, the elementary detection zones are grouped together as macro pixels with the semiconductor zones of each macro pixel being capable of being electrically connected in parallel.

More especially, the elementary detection surfaces of a macro pixel comprise areas having differently oriented parallel patterns, especially areas having patterns that are oriented substantially at right angles to each other. Alternatively, the elementary detection surfaces of a macro pixel comprise parallel patterns with the orientation of the patterns of one elementary detection surface being different to the orientation of the patterns of the adjacent detection surface, especially at right angles.

The conductor comprises, on the reflective layer side, a contact pad surface in order to hybridize the photodetector on an electronic circuit. This way, the photodetector can be mounted on a conventional readout circuit for example. The reflective layer and the contact pad surface can form just a single layer.

The semiconductor layer and the semiconductor zones are made of CdZnTe or CdHgTe.

BRIEF DESCRIPTION OF THE DRAWINGS

The present invention will be made more readily understandable by the following description which is given merely by way of example and relates to the accompanying drawings in which identical references denote identical or analogous components and in which:

FIG. 1 is a schematic top view of a photodetector according to the invention;

FIG. 2 is a cross-sectional view of the photodetector in FIG. 1 along line A-A;

DESCRIPTION OF THE PREFERRED EMBODIMENTS

Figure 3:
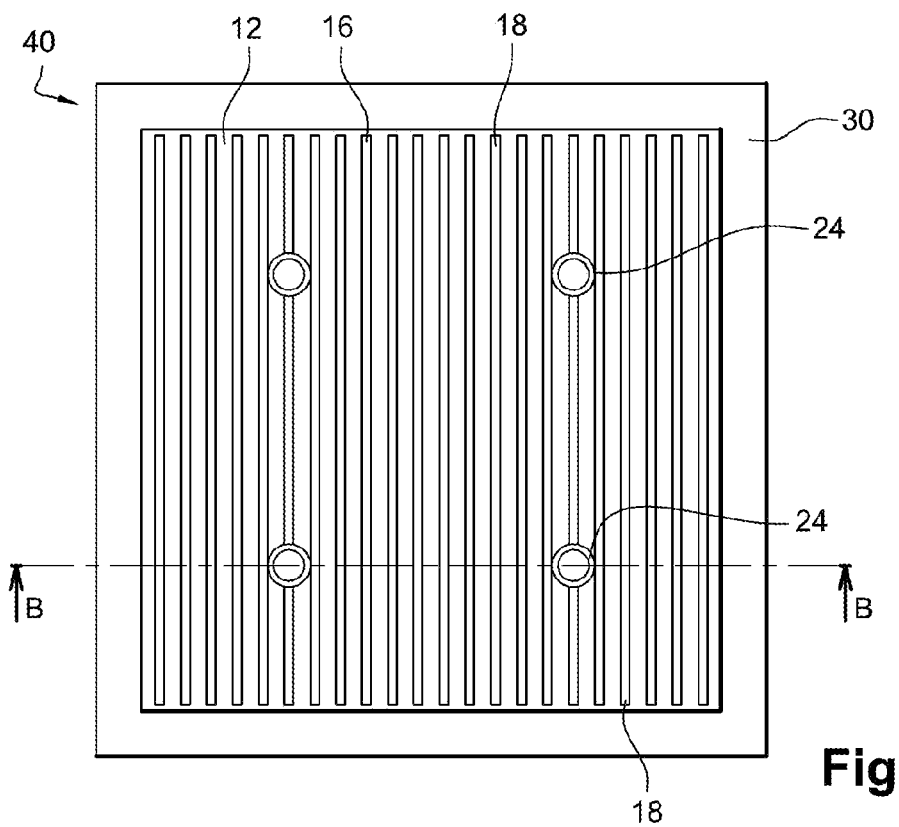
FIGS. 3 and 4 are schematic cross-sectional and top views respectively of a second embodiment of the invention.

A two-dimensional photodetector according to the invention is shown in FIGS. 1 and 2 under the general reference 10. This example shows a photodetector that comprises 2×2 pixels.

Photodetector 10 comprises a semiconductor absorption layer 12 that is several hundred nanometers thick wherein incident photons create electron-hole pairs; it is, for example, a p-doped semiconductor layer made of CdHgTe or CdZnTe in order to detect middle infrared radiation (wavelength of 3 to 5 μm) and/or far infrared radiation (wavelength of 8 to 10 μm); an insulating passivation layer 14 that is several dozen nanometers thick and deposited on semiconductor layer 12; a metallic structure 16, made of gold for example, formed by identical, straight, parallel metallic strips 18 having a rectangular cross-section. Structure 16, together with semiconductor layer 12, forms a surface plasmon resonator, as is known in itself from the prior art; a dielectric tuning layer 20 that is several dozen nanometers thick and deposited underneath semiconductor layer 12, for example a layer made of CdTe; and a reflective layer 22, for example a Bragg grating or a metallic reflective layer, deposited underneath tuning layer 20.

The photodetector also comprises a plurality of semiconductor zones 24 formed in semiconductor layer 12 that are doped differently to the semiconductor layer, for example zones made of CdHgTe or CdZnTe with n-doping.

A metal via 26 that forms a conductor, made of platinum for example, is also formed for each semiconductor zone 24. Via 26 extends from reflective layer 22 to at least zone 24 and is electrically insulated from metallic structure 16, for example by the fact that it does not fully penetrate absorption layer 12 and by the presence of insulating passivation layer 14. There is therefore no electrical path between semiconductor layer 12 and semiconductor zones 24 that passes through metallic structure 16. Note that the thickness of passivation layer 14 can be reduced, especially in order to optimize coupling between metallic structure 16 and semiconductor layer 12. In some configurations, this passivation layer 14 can even be omitted, with metallic structure 16 then being formed directly on semiconductor layer 12. Electrical insulation of vias 26 is then obtained by the fact that the latter do not fully penetrate layer 12.

Optionally, metallic contact pads 28 are also formed on the extension of vias 26 in order to hybridize photodetector 10 on readout circuit 30 by means of solder bumps 32, made of indium for example.

Advantageously, the dimensions and the spacing of strips 18 of metallic structure 16 are selected so that the electromagnetic field obtained from the incident electromagnetic radiation that impinges on the front face of the photodetector, i.e. the face provided with structure 16, is confined in absorption layer 12 between strips 18 and over a small thickness, especially a thickness of 200 to 500 nm.

Plasmonic structures are classic devices and are therefore not described here in greater detail for the sake of brevity. For more details about the operation of a plasmonic structure, the reader should, for instance, refer to Document WO 01/2275.

If the electromagnetic field is confined between strips 18, each semiconductor zone 24 is then advantageously located underneath a strip 18, thereby ensuring that the space where the photocurrent is collected and the dark current space coincide, thus optimizing the structure.

Moreover, tuning layer 20 and, more particularly, its thickness, can make it possible to choose the frequency of the incident radiation that resonates with the surface plasmons of metallic structure 16. For further details, the readers should refer to the document entitled "*Résonances photoniques dans les réseaux métalliques; théorie et application à la photodétection ultrarapide*" [Photonic resonances in metal grids; theory and application to ultra-fast photodetection], by Stéphane Collin, Paris University Thesis 6, 2002.

Note that tuning layer 20 is optional, depending on the precise geometry of the plasmonic structures used [cf. publication by J. Le Perchec "*Plasmon-based photosensors comprising a very thin semiconducting region*", Appl. Phys. Lett. 94, 181104 (2009)]. Note also that if reflective layer 22 is metallic, tuning layer 20 need not fulfill an optical function and, because of this, becomes an insulating passivation layer with a reduced thickness.

During operation, the front face of photodetector 10, i.e. the face provided with metallic structure 16, is exposed to the radiation that is to be detected. The incident electromagnetic field is then confined between strips 18 over a small thickness. In the space thus defined, electron-hole pairs are generated by photons being absorbed by the semiconductor material of layer 12. A potential difference is applied periodically between layer 12 and semiconductor zones 24. For example, layer 12 is subjected to a first potential, for example by means of the metallic structure or a separate peripheral electrode that is in contact with layer 12, and vias 26 are subjected to a second potential by means of readout circuit 30. The minority charge carriers then diffuse into zones 24 in order to be collected by means of vias 26.

Note that the charge carriers diffuse into the nearest semiconductor zone 24. In fact, elementary detection surfaces S1-S2 (see FIG. 1) are created around each zone 24. In the example shown in FIGS. 1 and 2, zones 24 are arranged in a square grid and therefore define square elementary detection surfaces. A 2×2 pixel imaging array is therefore obtained in this example.

An example of a method for fabricating a detector made of CdHgTe is described below:

1. grow absorption layer 12 made of CdHgTe on a CdZnTe substrate by molecular-beam epitaxy;
2. deposit dielectric tuning layer 20, followed by depositing reflective layer 22;
3. create a peripheral electrical contact on layer 12;
4. anneal this assembly in order to obtain p doping in the CdHgTe layer, for example between 200° C. and 300° C. for several hours;
5. machine vias 26 as far as the CdHgTe layer, this creates annular semiconductor zones 24 and forms contact pads 28. Semiconductor zones 24 can also be obtained through an ion implantation step;
6. hybridize the assembly thus obtained on circuit 30 by means of solder bumps 32;
7. make the substrate of circuit 30 thinner;
8. deposit passivation layer 14 on absorption layer 12;
9. deposit a resin, followed by exposure using a mask having the same topology as metallic structure 16;
10. deposit the metal that constitutes metallic structure 16; and
11. lift-off the metal: remove the resin and the metal that was deposited on the latter.

In one variant, it is also possible to actually use contact pads 28 as a reflector. In this configuration, layers 22 and 28 only form a single identical layer.

An embodiment in which vias 26 do not open out on the front face of photodetector 10 is described above. However, obtaining non-penetrative vias 26 can be complex and therefore expensive because it involves controlling the depth of etching in semiconductor layer 12 extremely accurately over an extremely small thickness. Also, for technology-related reasons associated, for instance, with the fabrication equipment that is used and which makes it necessary to hybridize the photodetector on readout circuit 30 before forming vias 26, the latter can be realized from the front face of the photodetector.

In a first variant, vias 26 are electrically insulated from metallic structure 16 by insulating passivation layer 14. Advantageously, metallic structure 16 can be partially or completely embedded in the mass of passivation layer 14 in order to enhance its insulating and/or passivating capability.

Figure 4:
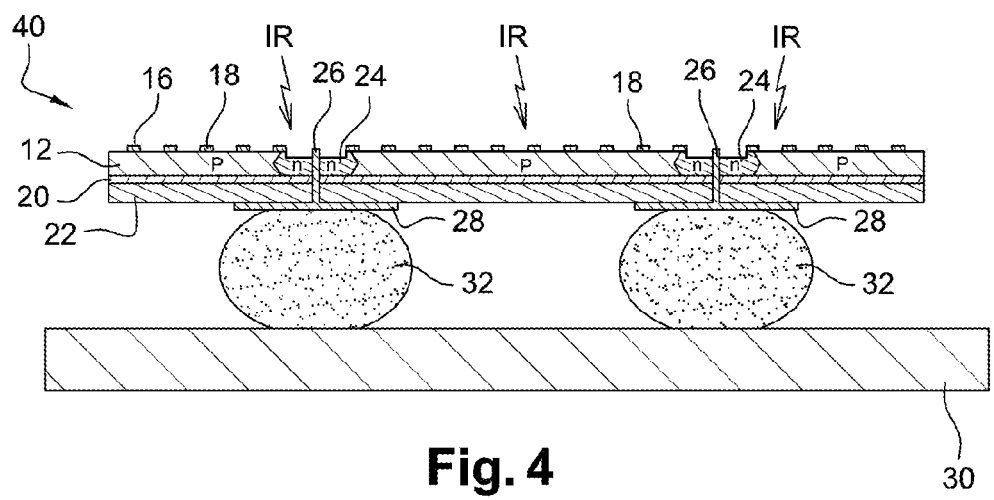

In a second variant in which insulating passivation layer 14 is absent, it is desirable to prevent any electrical contact between semiconductor layer 12 and semiconductor zones 24 through vias 26 and metallic structure 16. To achieve this, as shown in FIGS. 3 and 4, metallic structure 16 is eliminated around vias 26, advantageously over a surface area that makes allowance for inaccuracies in positioning the metallic structures and vias that are inherent in the technology used to fabricate them.

Embodiments wherein the metallic plasmonic structure assumes the form of identical, straight, parallel, regularly spaced strips are described above. This geometry does, however, exhibit polarization selectivity. In particular, the component of the electromagnetic radiation that is polarized at right angles to the strips is only weakly detected. Other types of metallic structure geometries are, however, possible, depending on the sought-after application.

Figure 5:
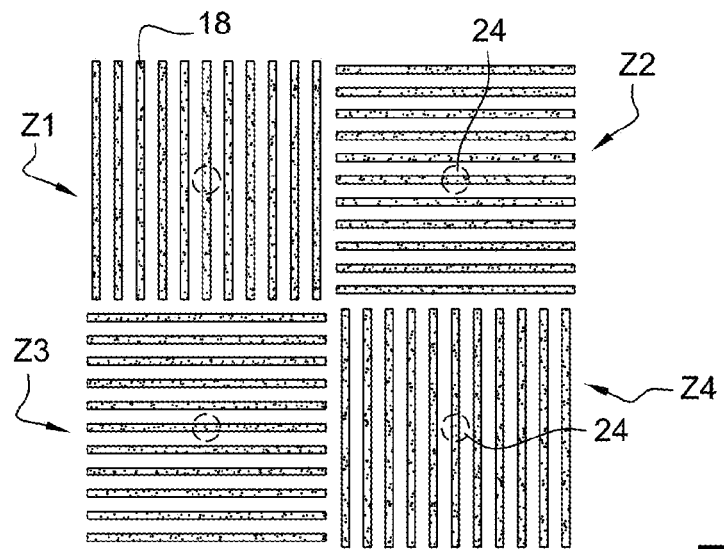
FIGS. 5 to 8 are schematic top views of several geometries of plasmonic structures according to the invention.

In particular, in one embodiment shown in FIG. 5, the metallic structure has a succession of zones Z1, Z2, Z3, Z4 that have different strip orientations and, advantageously, orientations that are at right angles in order to detect perpendicular polarizations. The centre of each zone Z1, Z2, Z3, Z4 has a semiconductor zone 24.

Combining the signals obtained from four adjacent pixels makes it possible to obtain a "macro pixel" that is a 2 pixel by 2 pixel square and whose signal contains perpendicular polarizations of the incident radiation.

One way of combining the signals from several pixels in order to form a macro pixel is to electrically connect contact pads 28 of these pixels or to provide, in readout circuit 30, tracks that connect the corresponding solder bumps 32 in parallel. Semiconductor zones 24 of the pixels are then electrically connected in parallel, thus forming the macro pixel. This optimizes the optical packing density and/or spectral response of the detector or even its polarization sensitivity. This parallel connection of the semiconductor zones can also be permanent or non-permanent. For example, the semiconductor zones can be connected in parallel by using controllable switches.

Note that other types of orientations are possible, for example in order to detect two electromagnetic radiations having different linear polarizations. The orientation of the strips is then selected depending on the polarization of these fields.

Figure 6:
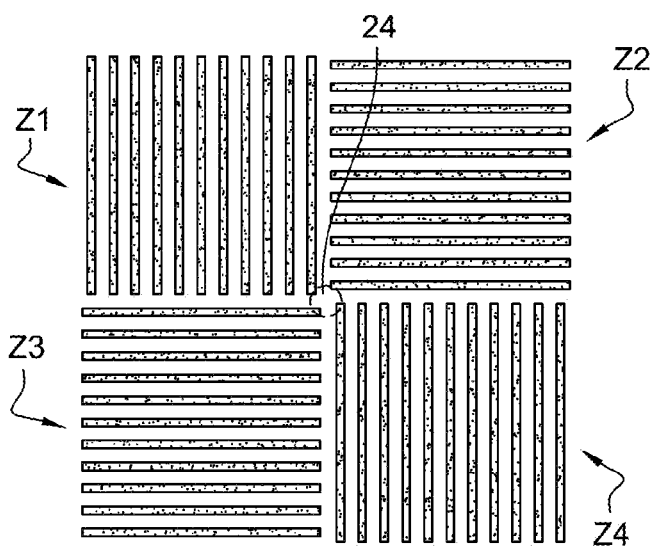

Rather than detecting different polarizations by combining the signals obtained from adjacent pixels, detection of different polarizations can be obtained directly by using a single pixel whose semiconductor zone 24 is located in the centre of the surface defined by zones Z1, Z2, Z3, Z4, as illustrated in FIG. 6. The elementary detection surface of one pixel thus comprises strips having different orientations—perpendicular orientations in this example.

Figure 7:
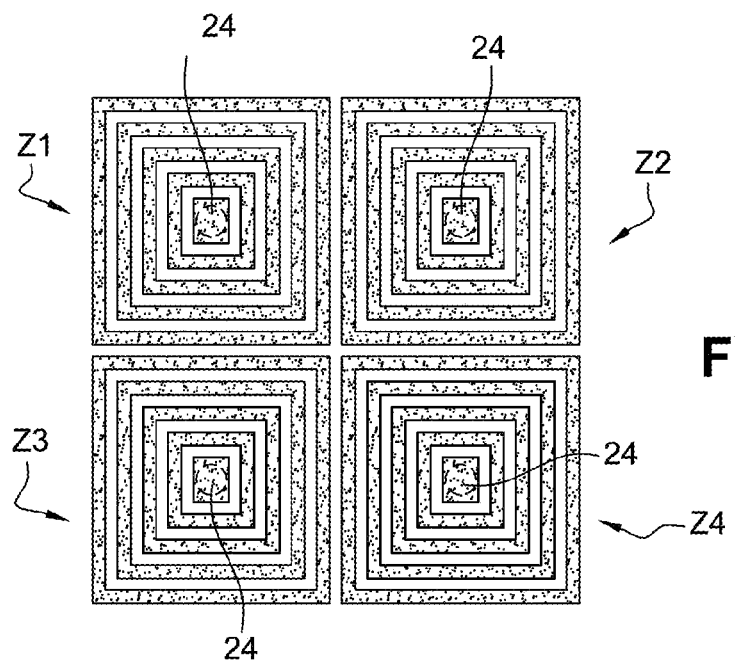

In order to make detection independent of polarization of the incident radiation, each semiconductor zone 24 is positioned in the centre of strips that form closed concentric contours, as shown in FIG. 7. In order to maximize the pixel packing density of the photodetector, the closed contours are advantageously square shaped, although other types of contours can be envisaged, e.g. concentric circular contours or even grids of patches having a defined shape.

Moreover, the width and spacing of the strips control the resonance frequency of the surface plasmons and hence the frequency at which the quantum efficiency of the photodetector exhibits high gain. Thus, providing a width and spacing that are unique to the metallic structure implies that the photodetector will be used for a predetermined frequency range. A photodetector that is sensitive to several frequency ranges may be required.

Figure 8:
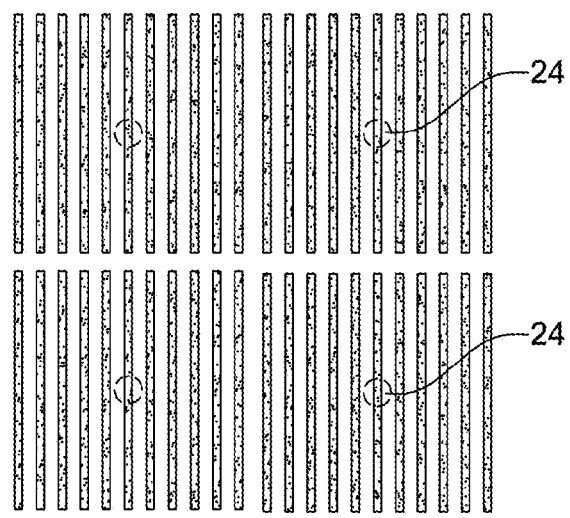

To achieve this, the metallic structure may comprise areas where strips having a first width and/or a first spacing alternate with other zones where the strips have a different width and/or spacing in order to obtain detection that is sensitive to several frequency ranges. FIG. 8 shows such detection which is sensitive to two frequency ranges with four adjacent pixels having their signals combined in order to obtain one macro pixel measuring two pixels by two pixels. It should be noted that the layout in FIG. 6 with its single semiconductor zone can also be used to obtain a pixel that is sensitive to two frequency ranges.

It is also possible to combine the above embodiments in order to obtain detection with several polarizations and several frequency ranges.

Note, however, that, regardless of the geometry of the metallic structure, every semiconductor zone 24 is advantageously positioned in the geometric barycenter of the part of the metallic structure that is bounded by the corresponding elementary detection surface in order not to modify the barycenter of the spectrum of the incident radiation during detection.

Embodiments in which semiconductor layer 12 is p-doped and the semiconductor zones are n-doped are described above. Obviously, the invention also applies in the case of an n-doped semiconductor layer and p-doped semiconductor zones 24.

The invention has the following advantages:
confinement of the electromagnetic field in the absorption layer in a very limited space and, consequently, a significantly reduced dark current while obtaining two-dimensional detection of radiation;
the possibility of hybridizing the photodetector on an electronic readout circuit thanks to vias that open out on the rear face of the latter;
polarization selectivity and frequency range selectivity by choosing an appropriate plasmonic structure; and
control of the detection wavelength by choosing an appropriate shape and dimensions for the mask that is used when forming the plasmonic structures, especially a mask with a variable side length. This allows different shapes for adjacent pixels and hence different spectral characteristics. Hyperspectral detection then becomes possible within the same absorption layer.

The invention claimed is:
1. A photodetector comprising:
a first doped semiconductor layer;
a reflective layer located underneath the first doped semiconductor layer; and
a metallic structure placed on the first doped semiconductor layer that forms, with said first doped semiconductor layer a surface plasmon resonator,
wherein it also comprises:
a plurality of semiconductor zones formed in the first doped semiconductor layer and oppositely doped to a doping of the first doped semiconductor layer; and
for each semiconductor zone, a conductor that passes through the photodetector from the reflective layer to at least the semiconductor zone and is electrically insulated from the metallic structure, with said semiconductor zone associated with a corresponding conductor thus determining an elementary detection surface of the photodetector.

2. The photodetector as claimed in claim 1, wherein it comprises dielectric tuning layer formed between the reflective layer and the semiconductor layer.

3. The photodetector as claimed in claim 1, wherein it comprises insulating passivation layer positioned between the semiconductor layer and the metallic structure.

4. The photodetector as claimed in claim 1, wherein the semiconductor zone is substantially formed in a geometric barycenter of a part of the metallic structure that is bounded by the elementary detection surface.

5. The photodetector as claimed in claim 1, wherein a part of the metallic structure bounded by the elementary detection surface comprises areas having differently orientated parallel patterns, especially areas having patterns that are substantially oriented at right angles to each other.

6. The photodetector as claimed in claim 1, wherein the metallic structure comprises a grid of metallic patches or a grid of holes formed in a metallic film.

7. The photodetector as claimed in claim 1, wherein a part of the metallic structure bounded by the elementary detection surface comprises long thin elements forming closed concentric contours, especially contours that have a substantially square or circular shape.

8. The photodetector as claimed in claim 1, wherein a part of the metallic structure bounded by the elementary detection surface comprises parallel patterns with an orientation of patterns of one elementary detection surface being different to an orientation of patterns of an adjacent detection surface, especially at right angles.

9. The photodetector as claimed in claim 1, wherein a part of the metallic structure bounded by the elementary detection surface comprises parallel patterns with a spatial periodicity of patterns of one elementary detection surface being different to spatial periodicity of patterns of an adjacent detection surface.

10. The photodetector as claimed in claim 1, wherein semiconductor zones of the plurality of semiconductor zones are grouped together as macro pixels, with semiconductor zones of each macro pixel being capable of being electrically connected in parallel.

11. The photodetector as claimed in claim 10, wherein elementary detection surfaces of a macro pixel comprise areas having differently oriented parallel patterns, especially areas having patterns that are oriented substantially at right angles to each other.

12. The photodetector as claimed in claim 10, wherein elementary detection surfaces of a macro pixel comprise parallel patterns with an orientation of patterns of one elementary detection surface being different to an orientation of patterns of an adjacent detection surface, especially at right angles.

13. The photodetector as claimed in claim 1, wherein the conductor comprises, on a same side as the reflective layer, a contact pad surface for hybridizing the photodetector on an electronic circuit.

14. The photodetector as claimed in claim 13, wherein the reflective layer and the contact pad surface form only a single identical layer.

15. The photodetector as claimed claim 1, wherein the semiconductor layer and the semiconductor zones are made of CdHgTe or CdZnTe.

* * * * *